(12) United States Patent
Ju et al.

(10) Patent No.: US 10,990,542 B2
(45) Date of Patent: Apr. 27, 2021

(54) FLASH MEMORY SYSTEM AND METHOD OF GENERATING QUANTIZED SIGNAL THEREOF

(71) Applicant: KOREA INSTITUTE OF SCIENCE AND TECHNOLOGY, Seoul (KR)

(72) Inventors: Hyunsu Ju, Seoul (KR); Gyosub Lee, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 16/425,812

(22) Filed: May 29, 2019

(65) Prior Publication Data

US 2020/0026666 A1    Jan. 23, 2020

(30) Foreign Application Priority Data

Jul. 17, 2018    (KR) ........................ 10-2018-0082975

(51) Int. Cl.
| | |
|---|---|
| *G06F 12/14* | (2006.01) |
| *G11C 16/08* | (2006.01) |
| *G11C 16/22* | (2006.01) |
| *G11C 16/16* | (2006.01) |
| *G11C 16/26* | (2006.01) |
| *G11C 16/34* | (2006.01) |
| *G06F 12/02* | (2006.01) |
| *G06F 12/1009* | (2016.01) |
| *G06F 3/06* | (2006.01) |

(52) U.S. Cl.
CPC ........ *G06F 12/1475* (2013.01); *G06F 3/0688* (2013.01); *G06F 12/0246* (2013.01); *G06F 12/1009* (2013.01); *G11C 16/08* (2013.01); *G11C 16/16* (2013.01); *G11C 16/22* (2013.01); *G11C 16/26* (2013.01); *G11C 16/34* (2013.01)

(58) Field of Classification Search
CPC ......... G11C 16/08; G11C 16/16; G11C 16/22; G11C 16/26; G11C 16/34; G06F 12/0246; G06F 12/1009; G06F 12/1475; G06F 3/0688
USPC .................................. 711/103, 164, E12.008
See application file for complete search history.

(56) References Cited

U.S. PATENT DOCUMENTS

| | | | | |
|---|---|---|---|---|
| 5,677,867 A | * | 10/1997 | Hazani ................ | G11C 11/5621 257/E21.682 |
| 2008/0019188 A1 | * | 1/2008 | Li ...................... | G11C 16/3418 365/185.22 |
| 2009/0323422 A1 | * | 12/2009 | Alrod .................. | G11C 16/349 365/185.18 |

(Continued)

FOREIGN PATENT DOCUMENTS

KR    1020150143150 A    12/2015

*Primary Examiner* — Tuan V Thai
*Assistant Examiner* — Edward Waddy, Jr.

(57) ABSTRACT

The flash memory system according to the embodiment of the present invention is characterized by programming a selected page in a quantization signal generating operation, providing a reference read voltage to a selected word line connected to the selected page, A flash memory for generating a flash memory; And a memory controller for receiving a quantized signal from the flash memory and generating a response using the quantized signal, wherein the memory controller receives an challenge from a host and the flash memory performs the quantized signal generation.

20 Claims, 14 Drawing Sheets

(56) References Cited

U.S. PATENT DOCUMENTS

2014/0136765 A1* 5/2014 Oh .................. G11C 11/5642
  711/103
2016/0323096 A1* 11/2016 Kara-Ivanov ......... H04L 9/0866

* cited by examiner

FIG. 4
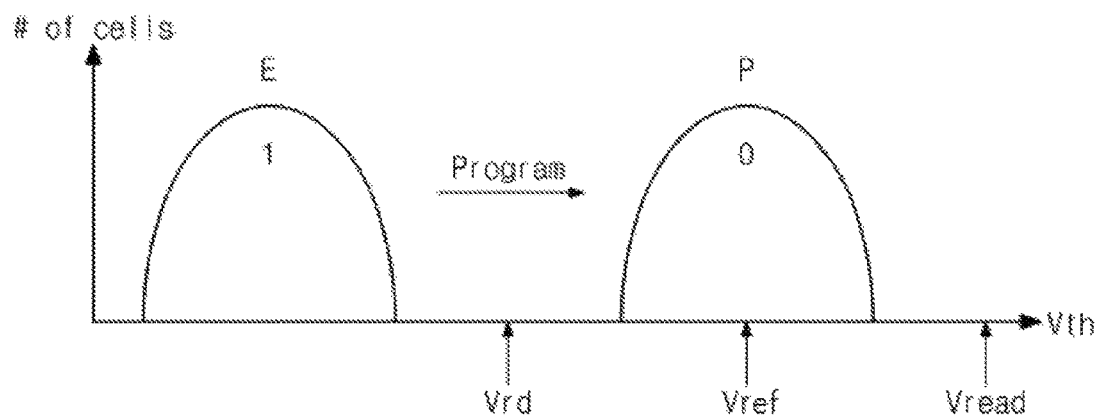
FIG. 5A
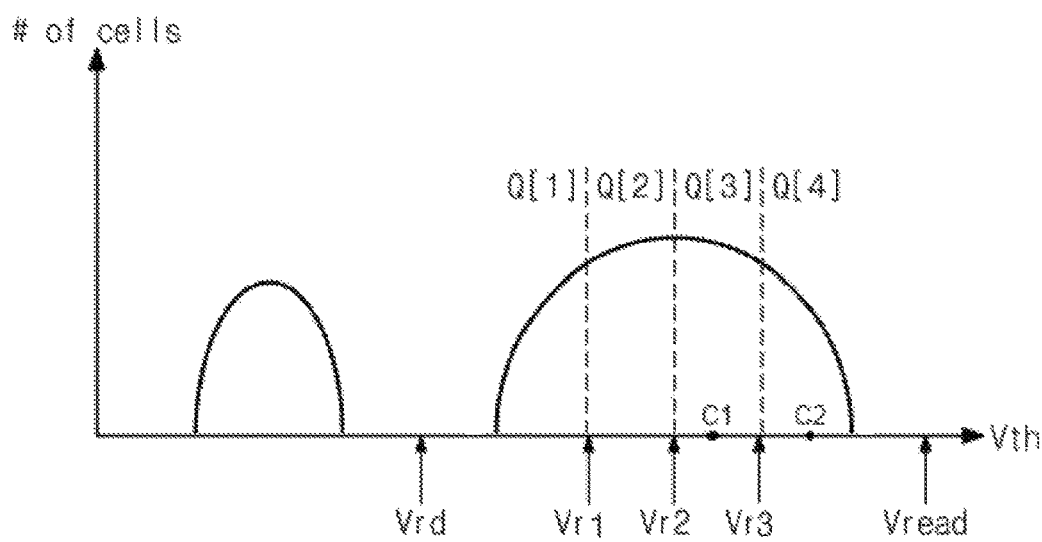
FIG. 5B
|      | C1 | C2 | C3 | C4 | C5 | C6 | C7 | ... | Cx | Cy | Cz |
|------|----|----|----|----|----|----|----|-----|----|----|----|
| Q[1] | 0  | 0  | 0  | 0  | 0  | 0  | 1  | ... | 0  | 1  | 0  |
| Q[2] | 0  | 0  | 0  | 1  | 0  | 1  | 1  | ... | 0  | 1  | 1  |
| Q[3] | 1  | 0  | 0  | 1  | 1  | 1  | 1  | ... | 0  | 1  | 1  |
| Q[4] | 1  | 1  | 1  | 1  | 1  | 1  | 1  | ... | 0  | 1  | 1  |
| Q[i] | 0  | 1  | 1  | 1  | 0  | 1  | 0  | ... | 0  | 0  | 1  |

FLASH MEMORY SYSTEM AND METHOD OF GENERATING QUANTIZED SIGNAL THEREOF

CROSS-REFERENCE TO RELATED APPLICATION

This application is based on and claims the benefit of priority to Korean Patent Application No. 10-2018-0082975, filed on Jul. 17, 2018, in the Korean Intellectual Property Office, the disclosure of which is incorporated herein in its entirety by reference.

TECHNICAL FIELD

The present disclosure relates to a flash memory system and, more particularly, to a flash memory system for generating a quantized signal using physical characteristics of a flash memory.

BACKGROUND

A PUF device is a device having a physically unclonable function and may be used in a user authentication system. The user authentication system requires a detection device for detecting an external attack to protect data or key from the external attack. When an external attack is detected, the user authentication system responds to the external attack in a manner of blocking a power or stopping the operation of a circuit. However, additional cost is incurred to use the detection device and a side-channel attack may be encountered. Thus, a key is not separately stored and a circuit or a logic playing a role such as fingerprint authentication is implemented to be used as a key. A PUF device is representatively used in this technology.

Even though internal circuits have the same internal configuration, wire delay or gate delay occurs according to a process of implementing the internal circuits, causing a minute difference in their characteristics. A PUF device uses a difference in operation characteristics. Since the PUF device uses a delay difference according to a process, physically cloneable circuits having the same output cannot be implemented even if the PUF device is opened. A PUF device circuit may be classified as a ring oscillator type using a delay loop and an arbiter type using a switching circuit. A PUF device may be implemented using these two types together.

A conventional PUF device generates a single response for a single challenge. Since the conventional PUF device has a one-to-one challenge-response pair (CRP), it may be vulnerable to an external attack. That is, less randomness for a single challenge causes the conventional PUF device to encounter many problems to solve for use in a user authentication system.

The present disclosure has been made to solve the above-mentioned technical problems, and it is an object of the present disclosure to provide a flash memory system that has a strong defense against an external attack by enhancing randomness for a challenge and a method of generating a quantized signal thereof.

SUMMARY

A flash memory system according to an embodiment of the present disclosure comprises a flash memory for programming a selected page and providing a reference read voltage to a selected word line coupled to the selected page during a quantization signal generating operation and generating a quantized signal by reading the selected page; and a memory controller for receiving the quantized signal from the flash memory and generating a response using the quantized signal. Wherein the memory controller receives a challenge from a host and controls the flash memory to perform the quantization signal generating operation.

In an embodiment, the selected page is programmed without a program verify operation. The selected page is programmed with one program voltage or an increasing program voltage. A plurality of reference read voltages are provided on the selected word line to separate into a plurality of quantization intervals. The number of quantization intervals is greater than the number of program states.

In another embodiment, the flash memory stores data for the quantized signal in some of the memory cells of the selected page. The challenge includes combination order information for some of the memory cells. The memory controller manages the combination order information for some memory cells using a map table of a flash translation layer. The memory controller manages data information matched to a threshold voltage distribution state of the flash memory using a map table of a flash translation layer. The memory controller receives the quantized signal from the flash memory and generates a quantized key.

A flash memory system according to an embodiment of the present disclosure comprises a flash memory for programming a memory block such that a threshold voltage distribution is grouped in units of subblocks and generating a quantized signal by providing a reference read voltage to selected pages of selected subblocks during a quantization signal generating operation; and a memory controller for receiving the quantized signal from the flash memory and generating a response using the quantized signal, wherein the memory controller receives an challenge from a host and controls the flash memory to perform the quantization signal generating operation. The flash memory programs the memory block with the same data applying the different program voltage for each subblock.

A method of generating a quantized signal of a flash memory system comprises, receiving a challenge from a host; selecting a word line according to address information included in the challenge, and programming a selected page connected to the selected word line; and providing a reference read voltage to the selected word line, and generating a quantized signal by reading the selected page, wherein the flash memory system generates a response using the quantized signal and provides the response to the host.

BRIEF DESCRIPTION OF THE DRAWINGS

FIG. 4 is a diagram showing a threshold voltage distribution of a memory cell according to a program operation of the flash memory shown in FIG. 3.

FIG. 5A is a diagram explaining a quantization signal generating operation of the flash memory shown in FIG. 3.

FIG. 5B is a table exemplarily explaining the quantization signal generating operation.

DETAILED DESCRIPTION

Hereinafter, embodiments of the present disclosure will be described clearly and in detail so that those skilled in the art can easily carry out the present disclosure.

Figure 1:
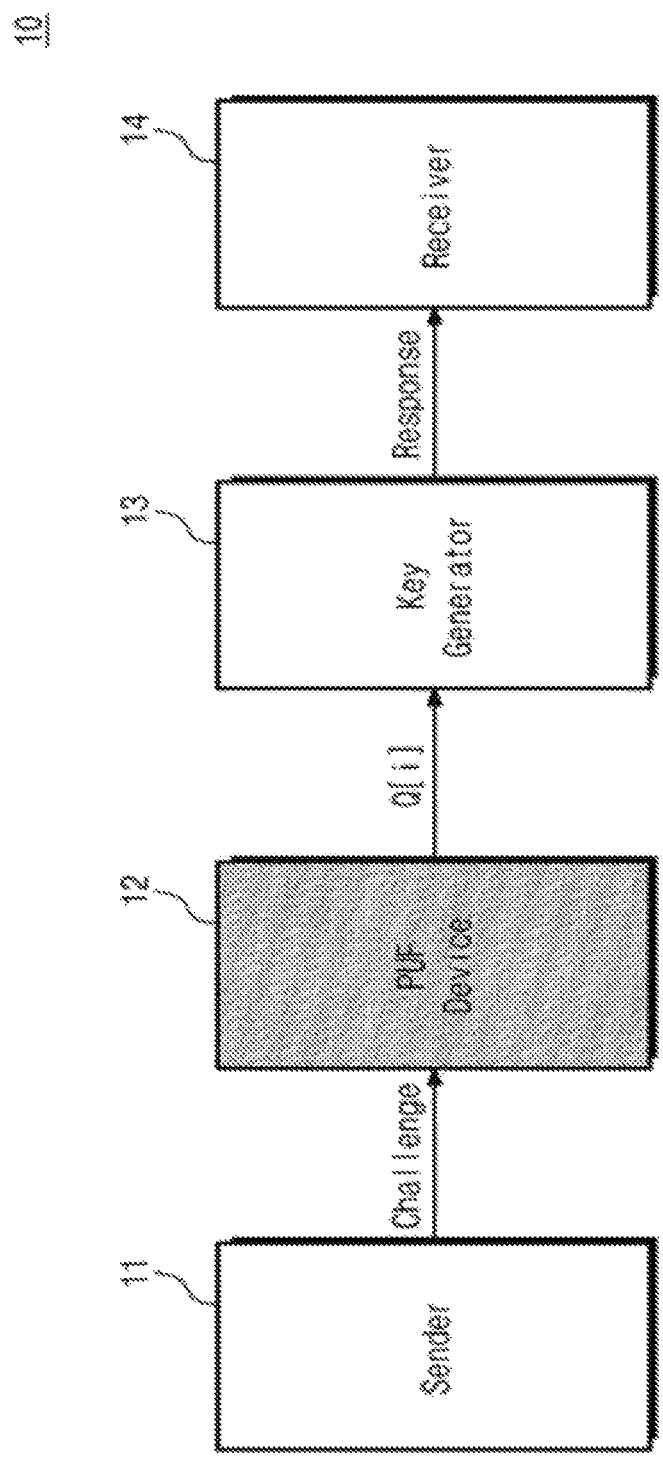
FIG. 1 is a block diagram exemplarily showing an user authentication system in accordance with an embodiment of the present invention.

FIG. 1 is a block diagram of a user authentication system 10 according to example embodiments of inventive concepts. As illustrated, the user authentication system 10 may include a sender 11, a PUF device 12, a key generator 13, and a receiver 14.

The sender 11 may generate a challenge for user authentication, and the receiver 14 may receive a response. The user authentication system 10 may perform a user authentication operation using a challenge-response pair (CRP). Although it is shown in FIG. 1 that the sender 11 and the receiver 14 are separated from each other, they may be implemented as single device for user authentication (e.g., a host or a server).

The PUF device 12 may receive a challenge and output a quantized signal Q[i]. The PUF device 12 is a memory having a physically unclonable function, which may secure randomness by process variation and stochastic switching.

The PUF device 12 may be implemented using a non-volatile memory (NVM). Nonvolatile memories may include a flash memory. The flash memory includes a memory cell array which includes a plurality of memory cells. The flash memory may have a large cell-to-cell variation even through the same fabrication process. The flash memory may have a large cycle-to-cycle variation when a program-erase cycle is repeated on the same memory cell. The cell-to-cell variation or the cycle-to-cycle variation may mean a variation in threshold voltage between memory cells.

Single bit data or multi-bit data of two or more bits may be stored in each memory cell of the flash memory. A memory cell storing a single bit of data may store data "1" or "0". A memory cell storing two bits of data may store data "11", "10", "01" or "00". A memory cell storing three bits of data may store data "111", "100", . . . , and "000".

A challenge applied to the PUF device 12 may include information on an address to select a memory cell and a resistance state level (or threshold voltage level) of a selected memory cell. The PUF device 12 may receive the challenge and apply a program voltage or an initialize voltage to selected memory cells. The PUF device 12 may repeatedly perform program-initialize operations on selected memory cells and read out a current flowing to the selected memory cells to generate a quantized signal Q[i]. The quantized signal Q[i] may be output in a bit string form.

The key generator 13 may receive the quantized signal Q[i] from the PUF device 12 and generate an encrypted key. The user authentication system 10 may encounter an external attack such as probing, fault injection or power analysis. The key generator 10 may encrypt a quantized signal and generate an encrypted key to protect data from the external attack. The encrypted key may be provided to a response for user authentication.

Although it is shown in FIG. 1 that the key generator 13 is disposed outside the PUF device 12, the key generator 13 may be included in the PUF device 12. The key generator 13 may generate a key without encrypting a quantized signal.

The user authentication system 10 according to example embodiments of inventive concepts includes the PUF device 12 based on a nonvolatile memory which single bit data or multi-bit data can be stored in a single memory cell. In inventive concepts, a physically unclonable function is reconfigurable and randomness may be enhanced using a nonvolatile memory. According to inventive concepts, an authentication operation may be performed more safely. The user authentication system 10 may be implemented using various types of the PUF device 12.

Figure 2:
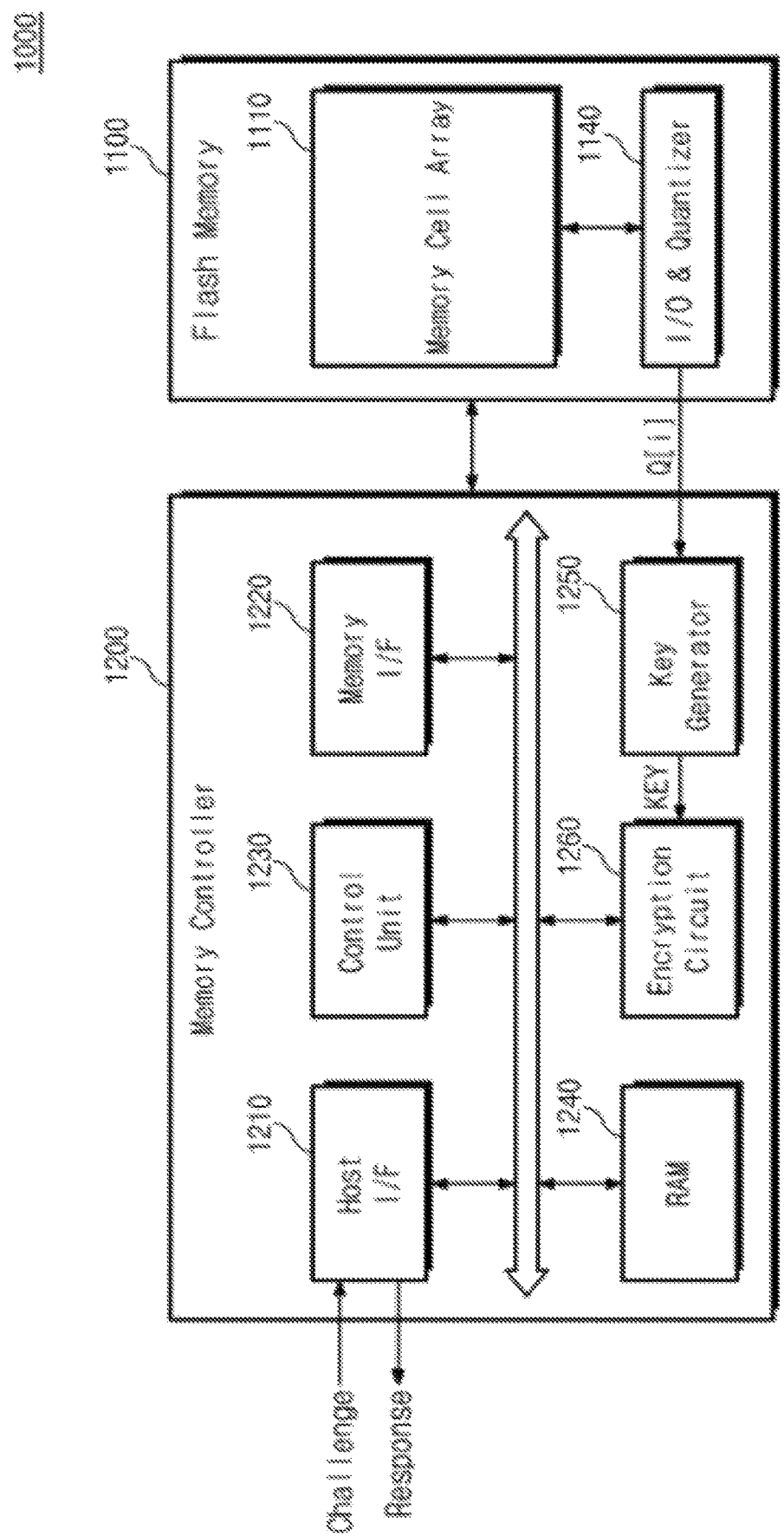
FIG. 2 is a block diagram showing a flash memory system including the PUF device and the key generator shown in FIG. 1.

FIG. 2 is a block diagram of a flash memory system including a PUF device and a key generator shown in FIG. 1. Referring to FIG. 2, the flash memory system 1000 includes a flash memory 1100 and a memory controller 1200. The flash memory system 1000 may be implemented as a flash memory based on data storage device, such as a memory card, a USB memory, a solid state drive (SSD), and the like.

The flash memory 1100 performs erase, program, and/or read operation(s) under the control of the memory controller 1200. The flash memory 1100 includes a memory cell array 1110 and a data input/output (input/output) and quantizer (input/output & Quantizer) 1140. The flash memory 1100 may perform erase operations by a memory block unit and perform program and/or read operations by a page unit.

The memory controller 1200 controls read and write operations on the flash memory 1100 in response to a request of an external entity (e.g., a host or a server). The memory controller 1200 may include a host interface 1210, a memory interface 1220, a control unit 1230, a RAM 1240, a key generator 1250, and an encryption circuit 1260.

The host interface 1210 may receive a challenge from an external entity (e.g., a host or a server) and provide a response. The host interface 1210 may be connected to a host through a PATA (Parallel AT Attachment) bus, a SATA (Serial ATA) bus, a SCSI, a USB or the like. The memory interface 1220 may provide an interface with the flash memory 1100.

The control unit 1230 may control the overall operation (e.g., read, write, file system management, etc.) on the flash memory 1100. For example, although not shown in FIG. 2, the control unit 1230 may include a central processing unit (CPU), a processor, an SRAM, a DMA controller, and the like. The control unit 1230 may mange software (or algorithm) for generating a quantized signal in the flash memory 1100. Software managed by the control unit 1230 may be driven through the RAM 1240.

The RAM 1240 may be used as a drive memory for a flash translation layer (FTL). The FTL may be used to manage a merge operation or a mapping table. The flash memory system 1000 according to example embodiments of inventive concepts may change a state-data matching scheme of the flash memory 1100 through a mapping table. For example, it will be assumed that a memory cell has data "11", "10", "01", and "00" according to a threshold voltage distribution. By changing the mapping table, a memory cell may be changed to have the data "00", "01", "10", and "11" according to a threshold voltage distribution. According to inventive concepts, randomness of the flash memory system 1000 may be enhanced and a method for generating keys may be reconfigurable, by changing a state-data matching scheme through the mapping table.

The RAM 1240 may operate under the control of the control unit 1230 and be used as a working memory, a buffer memory, a cache memory or the like. When the RAM 1240 is used as a working memory, the RAM 1240 may temporarily store data processed by the control unit 1230. When the RAM 1240 is used as a buffer memory, the RAM 1240 may buffer data to be transmitted from a host to the flash memory 1100 or from the flash memory 1100 to the host. When the RAM 1240 may be used as a cache memory, a low-speed flash memory 1100 may operate at high speed.

The key generator 1250 may generate a key using a quantized signal Q[i] provided from the flash memory 1100. The key generator 1250 may generate a key using various methods. The key generator 1250 may generate a key by combination of user information or a quantized signal Q[i]. The flash memory system 1000 according to example embodiments of inventive concepts may include the encryption circuit 1260. The encryption circuit 1260 may receive a key from the key generator 1250 and encrypt data or the quantized signal Q[i].

Figure 3:
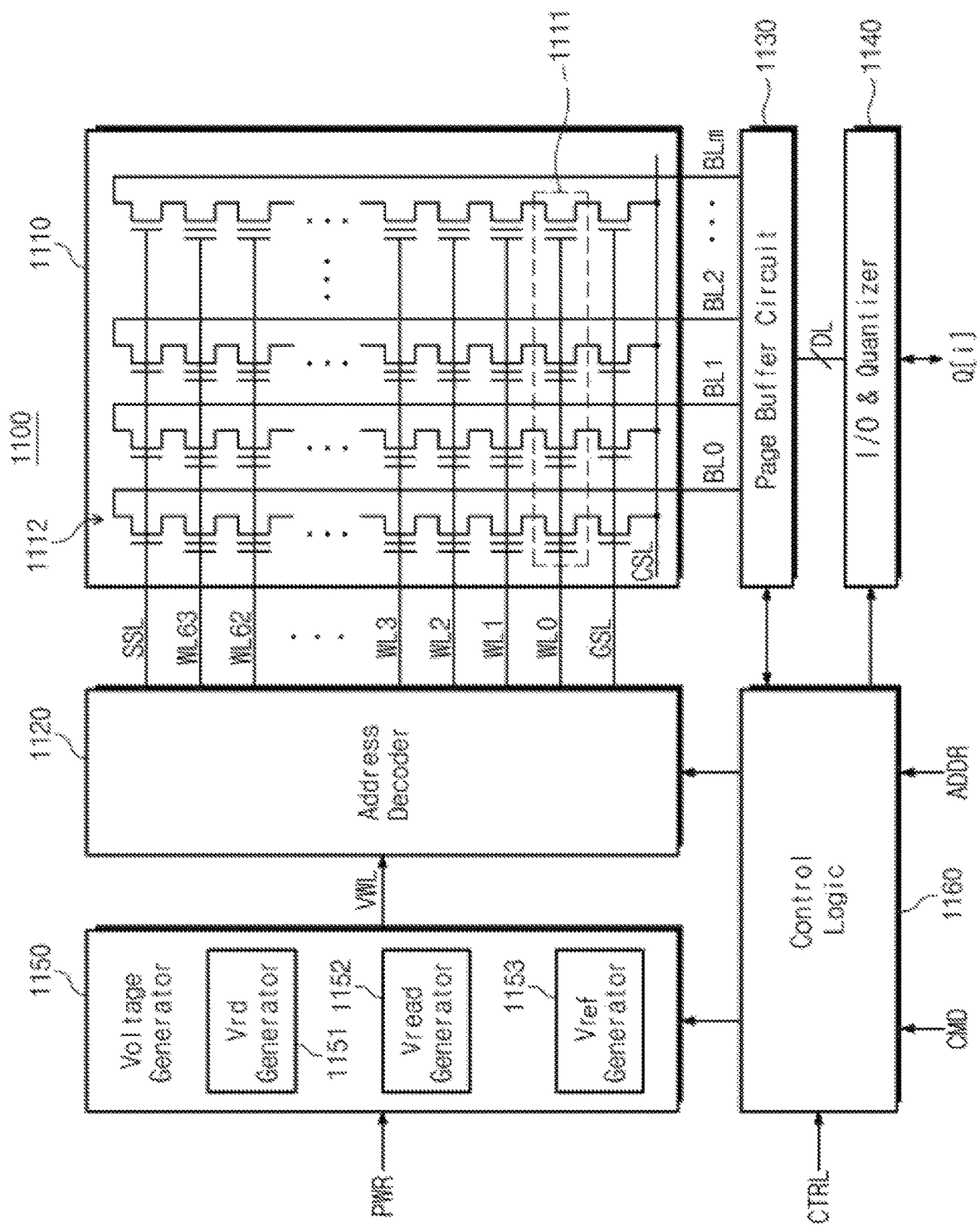
FIG. 3 is a block diagram exemplarily showing a flash memory shown in FIG. 2.

FIG. 3 is a block diagram further illustrating the flash memory 1100 of FIG. 2. Referring to FIG. 3, the flash memory 1100 comprises, in addition to the memory cell array 1110 and input/output and quantizer 1140; an address decoder 1120, a page buffer circuit 1130, a voltage generator 1150, and control logic 1160.

It is further assumed that the memory cell array 1110 is functionally divided into (e.g., accessed according to) a plurality of memory blocks. Only one memory block is shown in relevant portion within the memory cell array 1110 of FIG. 3. It is further assumed that each memory block includes a plurality of defined physical pages. For example, each physical page may be a set of flash memory cells commonly connected to a word line of the memory cell array 1110 (e.g., physical page 1111 of FIG. 3). Each memory cell may be configured a cell transistor having a control gate and a floating gate.

It is also assumed that the flash memory cells of the memory cell array 1110 are arranged in a plurality of defined cell strings 1112. Each cell string 1112 includes a string selection transistor connected to a string selection line SSL, a plurality of memory cells respectively connected to a plurality of word lines WL0 to WL63, and a ground selection transistor connected to a ground selection line GSL. For each cell string 1112, the constituent string selection transistor is connected to a corresponding bit line, and the ground selection transistor is connected to a common source line CSL.

In the flash memory 1100, each flash memory cell may be used to store single bit data (i.e., may be operated to store single-bit data as a single-level, flash memory cell, or SLC), or be used to store multi-bit data (i.e., may be operated to store two or more bits of data as a multi-level cell, or MLC). A SLC storing single-bit data will operate in relation to an erase state and a program state, as indicated by respective, corresponding threshold voltage distributions. An MLC storing multi-bit data will operate in relation to an erase state and a plurality of program states, each respectively and correspondingly indicated by a threshold voltage distribution.

Returning to FIG. 3, the address decoder 1120 is connected to the memory cell array 1110 via selection lines SSL and GSL, or word lines WL0 to WL63. The address decoder 1120 may be used to select a word line (e.g., WL0 in the illustrated example) in response to the address information ADDR.

The page buffer circuit 1130 is connected to the memory cell array 1110 via bit lines BL0 to BLm. The page buffer circuit 1130 may include a plurality of individual page buffers (not shown), where each page buffer is connected to a corresponding bit line in a conventionally understood "all bit line structure". Alternately, two or more page buffers may be connected to a single bit line in a conventionally understood "shield bit line structure". The page buffer circuit 1130 may be used to temporarily store "program data" to be programmed to the selected page 1111 during a program operation, or to temporarily store "read data" retrieved from the selected page 1111 during a read operation.

The data input/output and quantizer 1140 is connected to the page buffer circuit 1130 via data lines DL and the memory controller 1200 via input/output lines. Accordingly, the data input/output and quantizer 1140 may receive program data from the memory controller 1200 during a program operation and provide read data to the memory controller 1200 during a read operation. Also the data input/output and quantizer 1140 may read out a quantized signal Q[i] during an authentication operation.

The voltage generator 1150 may receive a power-on signal (PWR) from the memory controller 1200 to generate word line voltages (WVL) for writing or reading data. As illustrated in FIG. 3, the voltage generator 1150 may include a selection read voltage generator 1151, a non-selection read voltage generator 1152, and a reference read voltage generator 1153.

The selection read voltage generator 1151 may be used to generate a selection read voltage (Vrd) applied to a selected word line (e.g., WL0) during various operations. The non-selection read voltage generator 1152 may be used to generate a non-selection read voltage (Vread) applied to unselected word lines (e.g., WL1 to WL63) during various operations. For example, the non-selection read voltage (Vread) may have a voltage level sufficient to turn ON a selected memory cell in a selected cell string.

The referencer read voltage generator 1153 may be used to generate one or more reference read voltage(s) (Vref) during an authentication operation. During the authentication operation, the reference read voltage generator 1153 generates a defined reference read voltage (Vref) that is applied to a selected word line WL0, while the non-selection read voltage generator 1152 generates the non-selection read voltage (Vread) applied to unselected word lines WL1 to WL63. The reference read voltage may be used to define quantization sections. The number of quantization sections for generating a quantized signal may be different according to the number of program states or the characteristic of a threshold voltage distribution. These will be described in some additional detail with reference to FIGS. 4 to 6.

The control logic 1160 may be used to control the programming, reading, and/or erasing of the flash memory 1100 in response to one or more commands (CMD), address(es) ADDR, and control signal(s) CTRL. For example, during a read operation, the control logic 1160 may control the address decoder 1120 to provide the selection read voltage (Vrd) to a read-selected word line WL0, while also providing defined control signals to the page buffer circuit 1130 and the data input/output and quantizer 1140 in order to read data programmed at the selected page 1111. During the authentication operation, the control logic 1160 may be used to control the generation of the quantized signal Q[i] by providing one or more reference read voltage(s) (Vref) to the selected word line WL0.

The flash memory 1110 may intrinsically exhibit a threshold voltage distribution difference between memory cells even through the same fabrication process. Due to this physical property, the flash memory 1110 may be effectively used in a PUF device. The flash memory 1110 may have randomness and uniqueness which are basic elements of a PUF device.

FIG. 4 is a diagram showing a threshold voltage distribution of a memory cell according to a program operation of the flash memory shown in FIG. 3. FIG. In FIG. 4, the horizontal axis represents the threshold voltage (Vth) of the memory cell, and the vertical axis represents the number of memory cells (# of cells). When at least one page is programmed with the same data (e.g., data 0), the memory cell may have a threshold voltage distribution as shown in FIG. 4.

In the quantization signal generating operation, the flash memory 1100 may perform a one shot program operation. The one shot program operation means an operation of executing a program for the selected page 1111 without performing a program verify operation. That is, in the quantization signal generating operation, the flash memory 1100 applies the program voltage to the selected page 1111 and terminates the program operation. The program voltage may be one voltage level or a plurality of voltage levels. When there are a plurality of program voltage levels, the program voltage may gradually increase as the program operation proceeds.

The flash memory 1100 performs an erase operation before programming on the physical characteristics that can not be overwritten. Every time the flash memory 1100 repeats a program-erase cycle (P/E cycle), the threshold voltage level can be changed even if the same data is programmed in the same memory cell. This phenomenon is called cycle-to-cycle variation. The present invention can increase randomness due to cycle-to-cycle variation in flash memory cells during an authentication operation.

Among the physical characteristics of the flash memory 1100 that can increase the randomness are program noise and read noise. The program noise is caused by having a different threshold voltage moving speed for each memory cell. Program noise is an element that affects the threshold voltage distribution of a memory cell, and each program state has a distribution similar to a normal distribution. Generation of the quantized signal Q[i] using the flash memory 1100 is based on the normal distribution characteristic of the program state.

The read noise is a phenomenon in which the read data varies even if the same read voltage is applied to the same page where the specific data is stored. The flash memory 1100 may generate the quantized signal Q[i] using this read noise characteristic.

As shown in FIG. 4, when all the memory cells in one page are programmed with specific data (for example, 0), the threshold voltage distribution of the memory cell forms a normal distribution curve. At this time, the reference read voltage Vref may be a voltage corresponding to a middle value of the threshold voltage distribution. The flash memory 1100 performs a quantization signal generating operation by applying the reference read voltage Vref to the selected word line WL0 and applying the unselected read voltage Vread to the unselected word lines WL1 to WL63. On the other hand, a plurality of reference read voltages Vref may be provided in one program state P (see FIG. 5).

The quantized signal Q[i] corresponding to one page can be generated through the operation of generating the quantized signal. When a quantization signal generating operation is performed for a plurality of pages, a quantized signal Q[i] of the corresponding page size can be obtained. FIG. 4 shows an example of the SLC program operation. However, even in the case of the MLC program operation, the quantized signal Q[i] can be obtained from each program state (see FIG. 6).

FIG. 5A is a diagram for explaining a quantization signal generating operation of the flash memory shown in FIG. 3. And FIG. 5B exemplarily shows a table diagram for explaining a quantization signal generating operation.

FIG. 5A shows an example in which three reference read voltages Vref are provided in one program state P. When one or more memory cells of the selected page (see FIG. 3, 1111) are SLC programmed with the same data, the memory cell may have a threshold voltage distribution as shown in FIG. 5A. The flash memory 1100 may generate the quantized signal Q[i] through a reference read voltage of several levels.

Referring to FIG. 5A, after one-shot programming of the selected memory cell, first to third reference read voltages Vr1, Vr2, and Vr3 are applied to the selected word line WL0. The first to fourth quantized signals Q[1] to Q[4] may be generated according to the threshold voltages of the memory cells in the page. The number of quantization intervals for generating the quantized signal may be different from the number of threshold voltage distributions generated from the selected memory cells. In the example of FIG. 5A, the threshold voltage distribution period of the program state is divided into four quantization intervals based on the first to third reference read voltages Vr1, Vr2, and Vr3. A quantized signal generated in each quantization interval.

FIG. 5B exemplarily shows quantized signals generated by the first to third reference read voltages Vr1, Vr2, and Vr3 shown in FIG. 5A. In the table of FIG. 5B, the number in the lateral direction indicates the number of the memory cell. For example, the first to z-th memory cells C1 to Cz are shown. And the vertical direction represents the first to fourth quantized signals Q[1] to Q[4].

FIGS. 5A and 5B, the first and second quantized signals Q[1] and Q[2] of the first memory cell C1 are 0, the third and fourth quantized signal[3] and Q[4] are 1. This is because the first memory cell C1 is in the third quantization period, as shown in FIG. 5A. That is, the threshold voltage of the first memory cell C1 is higher than the first and second reference read voltages Vr1 and Vr2 and lower than the third reference read voltage Vr3. The first memory cell C1 is off-cell when the first and second reference read voltages Vr1 and Vr2 are applied and becomes an on-cell when the third reference read voltage Vr3 is applied.

The first to third quantized signals Q[1] to Q[3] of the second memory cell C2 are 0 and the fourth quantized signal Q[4] is 1. As shown in FIG. 5A, this is because the second memory cell C2 is in the fourth quantization period. That is, this is because the threshold voltage of the second memory cell C2 is higher than the first to third reference read voltages Vr1 to Vr3. When the first to third reference read voltages Vr1 to Vr3 are applied, the second memory cell C2 becomes an off-cell. In this manner, the first to fourth quantized signals Q[1] to Q[4] of the third to z-th memory cells C3 to Cz can be generated.

The data input/output and quantizer 1140 may generate first to fourth quantized signals Q[1] to Q[4] and generate the quantized signals Q[i] through a quantization operation. The quantization operation can be performed in various ways. For example, the quantization operation can be performed through an XOR operation ⊚ as shown in the following expression.

$$Q[i]=Q[1]\circledcirc Q[2]\circledcirc Q[3]\circledcirc Q[4]$$

The first to fourth quantized signals Q[1] to Q[4] are obtained by reading the data of the selected page 1111 into the page buffer circuit 1130 and outputting the data through the data input/output and quantizer 1140. In the first quantization period, the first quantized signal Q[1] is generated. Likewise, the second to fourth quantized signals Q[2] to Q[4] are generated in the second to fourth quantization sections. The quantized signal Q[i] generated through the quantization operation may be provided to the memory controller (see FIG. 2) 1200 through the data input/output line.

Figure 6:
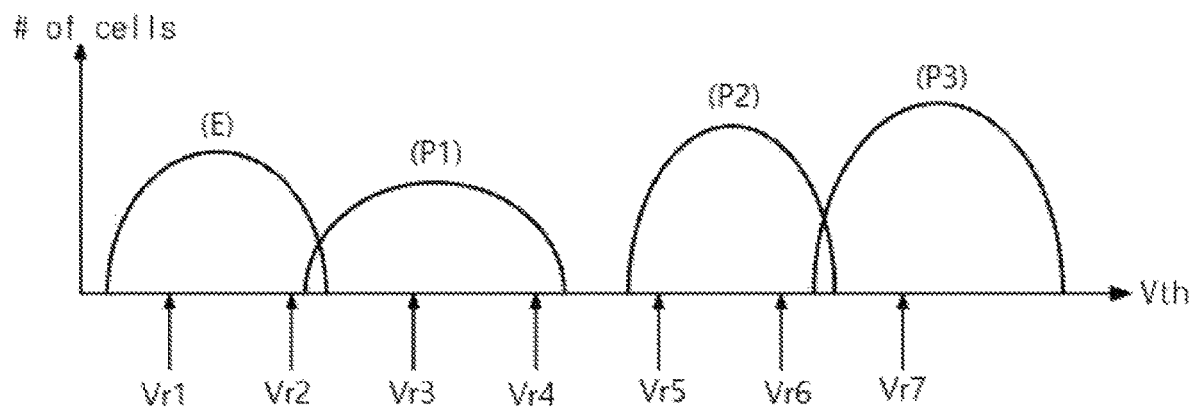
FIG. 6 is a diagram showing a threshold voltage distribution according to the MLC program operation of the flash memory shown in FIG. 3.

FIG. 6 is a diagram showing a threshold voltage distribution according to the MLC program operation of the flash memory shown in FIG. 3. In the FIG. 6, the horizontal axis represents the threshold voltage (Vth), and the vertical axis represents the number of cells (# of cells). The memory cell shown in FIG. 3 may have any one of a plurality of program states. For example, in the case of storing 2-bit data in one memory cell, the memory cell may have four program states according to the threshold voltage distribution. If three-bit data is stored in one memory cell, the memory cell may have any one of eight program states.

Referring to FIG. 6, a memory cell may have four states (E, P1, P2, and P3) according to a threshold voltage Vth. The four states may be the erase state E and the first to third program states P1, P2, and P3. The memory cell in the erase state E may have data 11. The memory cells in the first to third program states P1, P2, and P3 may have data 10, 01, and 00, respectively. Here, data according to each state can be changed as much as possible according to a state-data matching scheme. For example, a memory cell in the erase state E may have data 00, and a memory cell in the third program state P3 may have data 11. The memory cells in the first and second program states P1 and P2 may have data 01 and 10, respectively.

The challenge (challenge) may include the address of the selected page (see FIG. 3, 1111) and information on the program state. When the program state included in the challenge is four, that is, when 2-bit data is programmed in the selected memory cell, it can have four state distributions as shown in FIG. 6. According to the challenge applied to the selection page 1111, the selected page 1111 may be programmed to have any one of four program states.

Referring to FIG. 6, the data input/output and quantizer (see FIG. 3, 1140) may perform a quantization operation through the first to seventh reference read voltages Vr1 to Vr7. The method of generating the quantized signal is the same as that described with reference to FIGS. 5A and 5B, and therefore will not be described here.

The number of reference read voltages and the interval between the levels may vary depending on the number of threshold voltage distributions, the performance of the data input/output and quantizer 1140. For example, a 3-bit MLC may have a greater number of reference read voltages than a 2-bit MLC, and the spacing between levels may be wider. Also, the better the performance of the data input/output and quantizer 1140, the larger the number of reference read voltages and the narrower the interval between levels.

Figure 7:
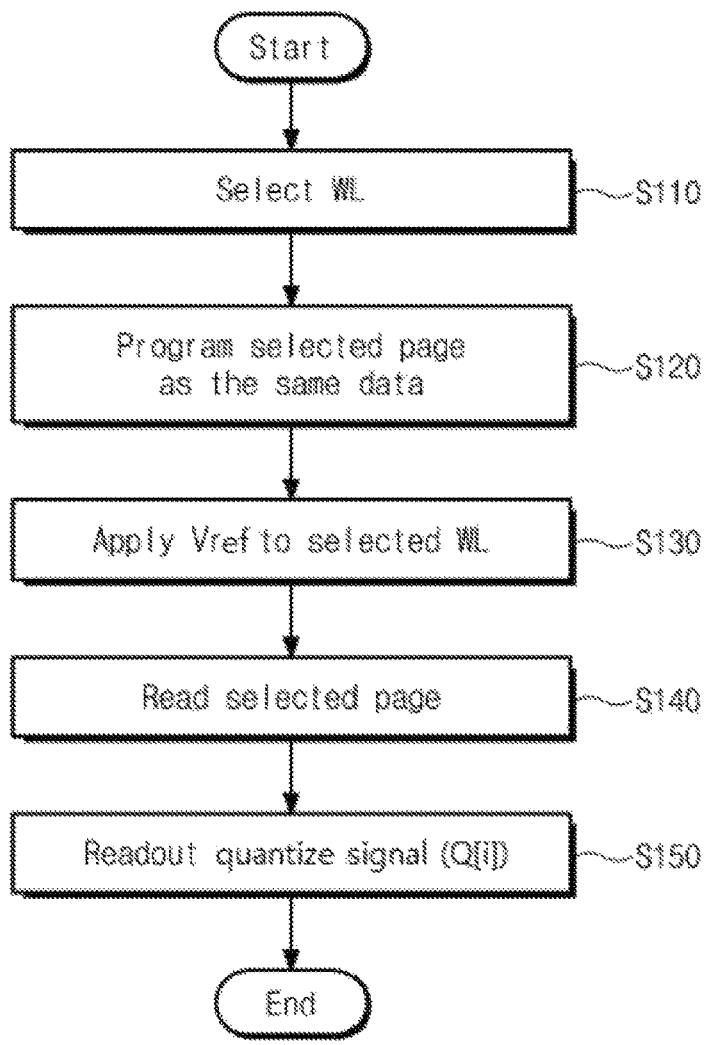
FIG. 7 is a flowchart illustrating a method of generating a quantized signal of the flash memory system shown in FIG. 2.

FIG. 7 is a flowchart illustrating a method for generating a quantized signal of the flash memory system shown in FIG. 2. Hereinafter, a method for generating a quantized signal of a flash memory system 1000 according to example embodiments of inventive concepts will now be described with reference to FIGS. 2 to 6. As described above, a challenge is provided to the flash memory system 1000. The challenge includes address information for selecting a memory cell and state level information on what state a selected memory cell is programmed in.

In S110, a wordline (e.g., WL0 in FIG. 3) to generate a quantized signal Q[i] is selected. Although only one page 1111 to generate the quantized signal Q[i] is shown in FIG. 3, more memory pages may be selected. As described in FIG. 6, the flash memory 1100 (see FIG. 3) may select one or more memory cells of a page and enhance randomness on an authentication operation by using the combination sequence of the selected memory cells.

In S120, a program operation for the selected page 1111 is performed. The same data may be programmed in all the memory cells or some memory cells in the selected page 1111. When programming the selected page 1111, the threshold voltage level of the selected page 1111 may be changed. When programming is performed while increasing the program voltage supplied to the selected word line WL0, a plurality of threshold voltage distributions can be obtained as shown in FIG. 6. Here, in the case of programming while increasing the program voltage, the program operation can be performed without the program verify operation.

In S130, a reference read voltage Vref is provided to the selected word line WL0. The number of reference read voltages can be made in accordance with the state distribution of the selected page 1111. As shown in FIG. 5, a plurality of reference read voltages Vr1, Vr2, and Vr3 may be provided in one state distribution. Also, as shown in FIG. 6, a plurality of reference read voltages Vr1 to Vr7 may be provided in a plurality of state distributions.

In S140, the data of the selected page 1111 corresponding to the reference read voltage Vref is read. As shown in FIG. 5A, the first memory cell C1 is read as an off-cell when the first and second reference read voltages Vr1 and Vr2 are applied, and an on-cell when the third reference read voltage Vr3 is applied. The second memory cell C2 is read as an off-cell when the first to third reference read voltages Vr1 to Vr3 are applied. In this manner, the data of the first to z-th memory cells C1 to Cz as shown in FIG. 5B are read and the first to fourth quantized signals Q[1] to Q[4] are generated.

In S150, the quantized signal Q[i] is output through the data input/output and quantizer 1140. The quantized signal Q[i] may be obtained by reading the data of the selected page 1111 according to the application of the reference read voltage Vref and performing a quantization operation through the data input/output and the quantizer 1140. The quantized signal Q[i] may be provided to a key generator (see FIG. 2, 1250) of the memory controller 1200.

As described above, the user authentication system 10 according to the embodiment of the present invention may generate challenge-response pair (CRP) with high randomness using the cell-to-cell variation or the cycle-to-cycle variation of memory cells of the PUF device 12. A conventional PUF device has a 1:1 challenge-response pair, but a PUF device 12 according to the embodiment of the present invention may have a 1:n challenge-response pair. Since the flash memory 1100 according to the embodiment of the present invention has a large cell-to-cell variation or a cycle-to-cycle variation, randomness is high and physical replication is virtually impossible.

Figure 8:
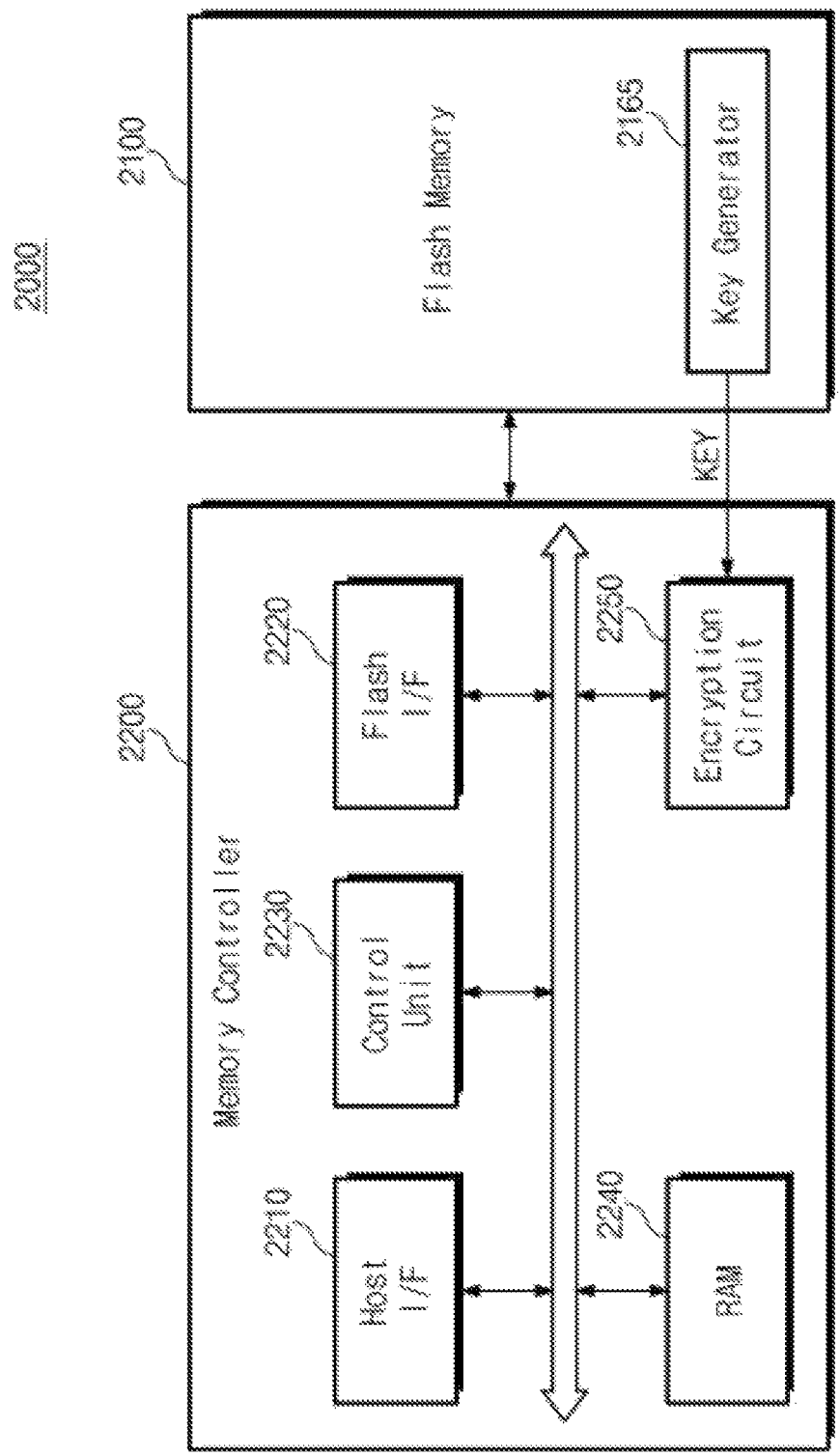
FIG. 8 is a block diagram illustrating a flash memory system according to another embodiment of the present invention.

FIG. 8 is a block diagram illustrating a flash memory system according to another embodiment of the present invention. Referring to FIG. 8, the flash memory system 2000 includes a flash memory 2100 and a memory controller 2200. The memory controller 2200 includes a host interface 2210, a flash interface 2220, a control unit 2230, a RAM 2240, and an encryption circuit 2250.

In the flash memory system 2000 shown in FIG. 8, a key generator 2165 is included in the flash memory 2100. The flash memory 2100 internally uses the quantized signal Q[i] to generate a key KEY and provides the generated key KEY to the encryption circuit 2250 of the memory controller 2200. The internal structure and operation of the flash memory 2100 including the key generator 2165 will be described in detail in FIG. 9.

Figure 9:
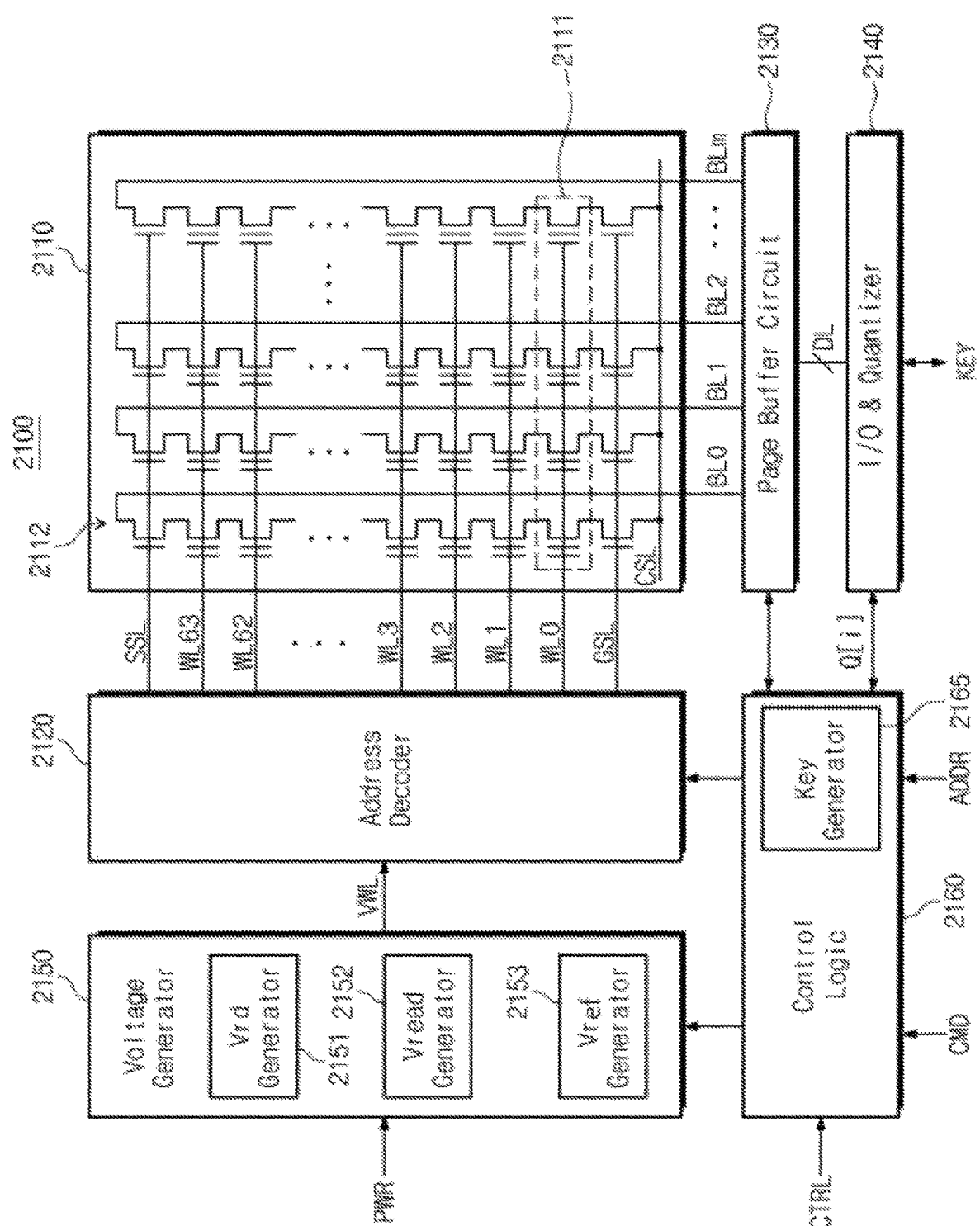
FIG. 9 is a block diagram exemplarily showing the flash memory shown in FIG. 8.

FIG. 9 is a block diagram exemplarily showing the flash memory shown in FIG. 8. Referring to FIG. 9, the flash memory 2100 includes a memory cell array 2110, an address decoder 2120, a page buffer circuit 2130, a data input/output and quantizer 2140, a voltage generator 2150, a control logic 2160.

Voltage generator 2150 includes a select read voltage generator 2151, an unselected read voltage generator 2152, and a reference read voltage generator 2153. The reference read voltage generator 2153 provides the reference read voltage Vref to the selected word line WL0 during the quantization signal generating operation.

The control logic 2160 includes a key generator 2165. The key generator 2165 receives the quantized signal Q[i] from the data input/output and quantizer 2140 and generates a key. The key is provided to the encryption circuit 2250 of the memory controller (see FIG. 8, 2200) via the data input/output and quantizer 2140. The encryption circuit 2250 encrypts the data using the key provided from the flash memory 2100 and provides the encrypted data to the flash memory 2100 or other memory (not shown).

The flash memory system 2000 shown in FIG. 8 generates a quantized signal using the characteristics of the threshold voltage distribution of the flash memory cell in the same manner as the flash memory system 1000 shown in FIG. 2. Since the present invention generates a quantized signal using the physical characteristics of the flash memory 2100, it is possible to increase the randomness in the authentication operation. The flash memory system 1000, 2000 according to an embodiment of the present invention can be used in a user authentication procedure of an electronic device.

Figure 10:
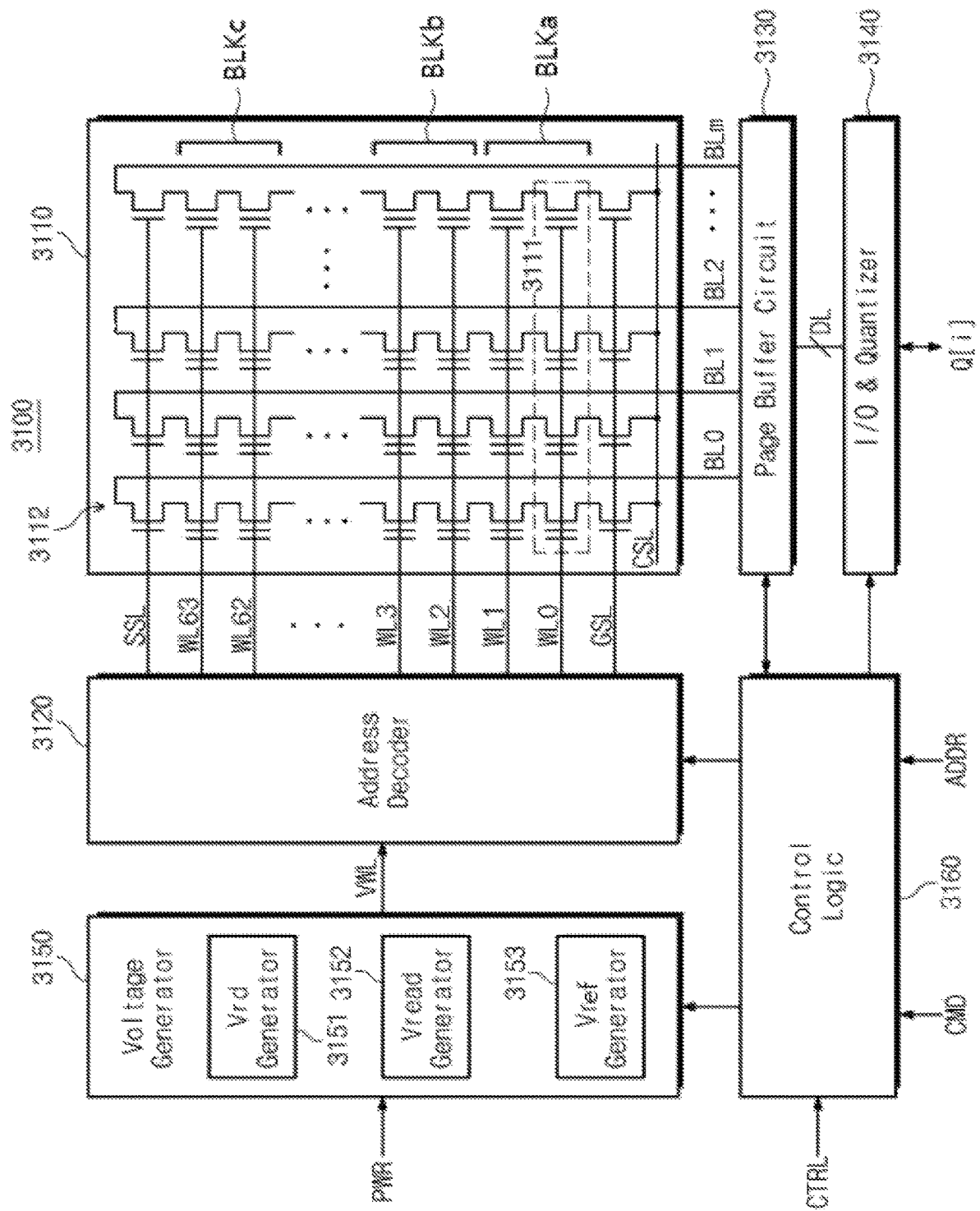
FIG. 10 is a block diagram exemplarily showing a flash memory according to another embodiment of the present invention.

FIG. 10 is a block diagram exemplarily showing a flash memory according to another embodiment of the present invention. Referring to FIG. 10, the flash memory 3100 includes a memory cell array 3110, an address decoder 3120, a page buffer circuit 3130, a data input/output and quantizer 3140, a voltage generator 3150, a control logic 3160. The voltage generator 3150 includes a select read voltage generator 3151, an unselected read voltage generator 3152, and a reference read voltage generator 3153.

The memory cell array 3110 may include a plurality of memory blocks. In FIG. 10, one memory block is shown as an example. One memory block may be divided into a plurality of subblocks (BLKa, BLKb, . . . BLKc). Each sub-block may be composed of a plurality of physical pages. In FIG. 10, each sub-block is composed of two physical pages. Reference numeral 3111 in FIG. 10 is an example of one physical page.

Figure 11:
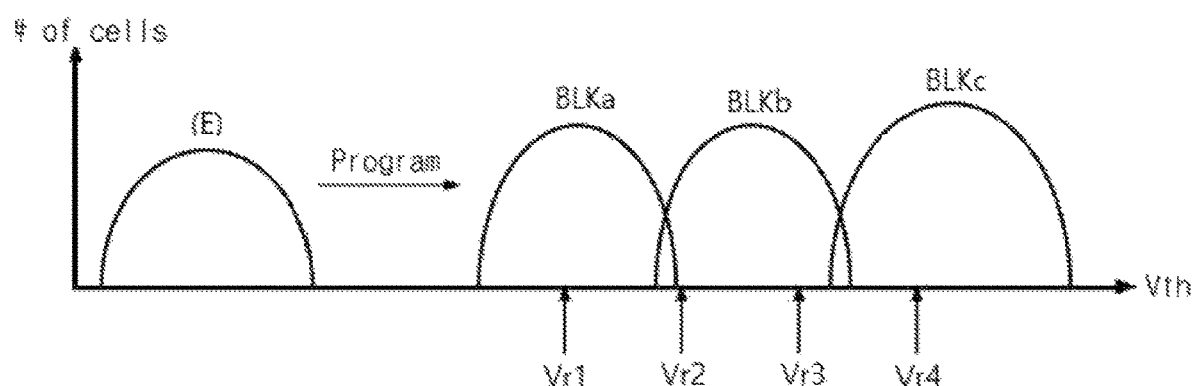
FIG. 11 is a diagram showing a threshold voltage distribution of the flash memory shown in FIG. 10.

FIG. 11 is a diagram showing a threshold voltage distribution of the flash memory shown in FIG. 10. The flash memory 3100 according to the embodiment of the present invention can group the threshold voltage distributions into sub-blocks in order to improve the randomness in the quantization signal generating operation. Referring to FIGS. 10 and 11, the first to third sub-blocks BLKa-BLKc may have different threshold voltage distributions.

The data input/output and quantizer (see FIG. 1, 3140) may perform quantization operations through the first to fourth reference read voltages Vr1 to Vr4. The method of generating the quantized signal is the same as that described with reference to FIGS. 5A and 5B, and therefore will not be described here. The flash memory 3100 shown in FIG. 10 can group the threshold voltage distributions by differently applying the program voltages to the sub-blocks. The present invention can increase the randomness in the authentication operation by grouping threshold voltage distributions for each sub-block of the flash memory 3100.

Figure 12:
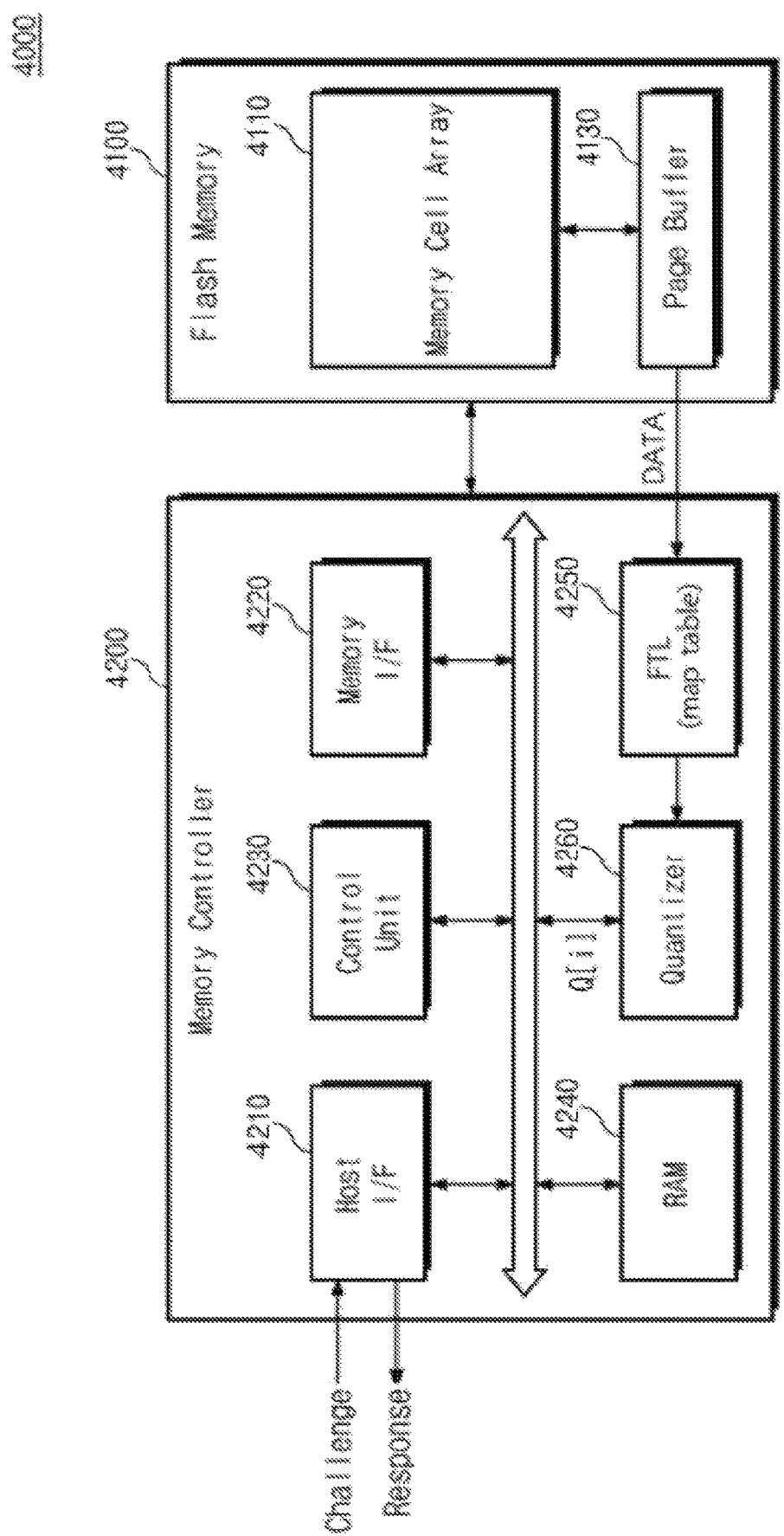
FIG. 12 is a block diagram illustrating a flash memory system according to another embodiment of the present invention.

FIG. 12 is a block diagram showing a flash memory system according to another embodiment of the present invention. Referring to FIG. 12, the flash memory system 4000 includes a flash memory 4100 and a memory controller 4200. The flash memory 4100 includes a memory cell array 4110 and a page buffer circuit 4130. The memory controller 4200 includes a host interface 4210, a memory interface 4220, a control unit 4230, a RAM 4240, a flash translation layer (FTL) 4250, and a quantizer 4260.

The flash translation layer (FTL) 4250 may be software or firmware and may be run in RAM 4240 under control of control unit 4230. The flash translation layer 4250 may operate a map table to define a connection relationship between the logical address and the physical address.

The flash translation layer 4250 may have a block mapping method, a page mapping method, or a hybrid mapping method depending on the operating method. The hybrid mapping combines the block mapping method and the page mapping method. The block mapping method converts the logical block address provided by the host into the physical block address of the flash memory 4100, and the page mapping method converts the logical page address into the physical page.

The challenge provided by the host may include the logical address of the selected memory block or the selected page. The logical address of the selected memory block or selected page may be converted to a physical address via the flash translation layer 4250. The flash memory 4100 may store data at a physical address. The data stored in the physical address of the flash memory 4100 may be provided to the memory controller 4200 via the page buffer circuit 4130. The quantizer 4260 may use the flash translation layer 4250 to quantize the data provided from the flash memory 4100.

The challenge may include information on a combination order of memory cells necessary for quantization among the memory cells in the selected page. For example, assume that there are 128 memory cells in a page and 4-bit data can be stored in one memory cell. In this case, the number of threshold voltage distributions is 16. If the response is 256-bit, 64 memory cells out of the memory cells in a page are arithmetically required. That is, 256/4=64.

The number of memory cells in one page is 128, and 64 memory cells among 128 memory cells are selected to determine the combination order. The number of cases is as shown in the following expression.

$$P(128,64)=128!/(128-64)!=30,391\times10,126$$

The flash translation layer 4250 can manage information on the combination order of memory cells required for quantization by the number calculated in the above equation through the map table. In addition, the flash translation layer 4250 can manage the state-data matching information described above. The challenge may also include state-data matching information in addition to the address and state distribution of the selected memory cell. The randomness of the flash memory system 4000 can be further improved when the challenge includes the combination order of the memory cells and the state-data matching information, necessary for quantization.

The flash memory system 1000, 2000, 4000 according to an embodiment of the present invention may be used in a user authentication procedure of an electronic device.

Figure 13:
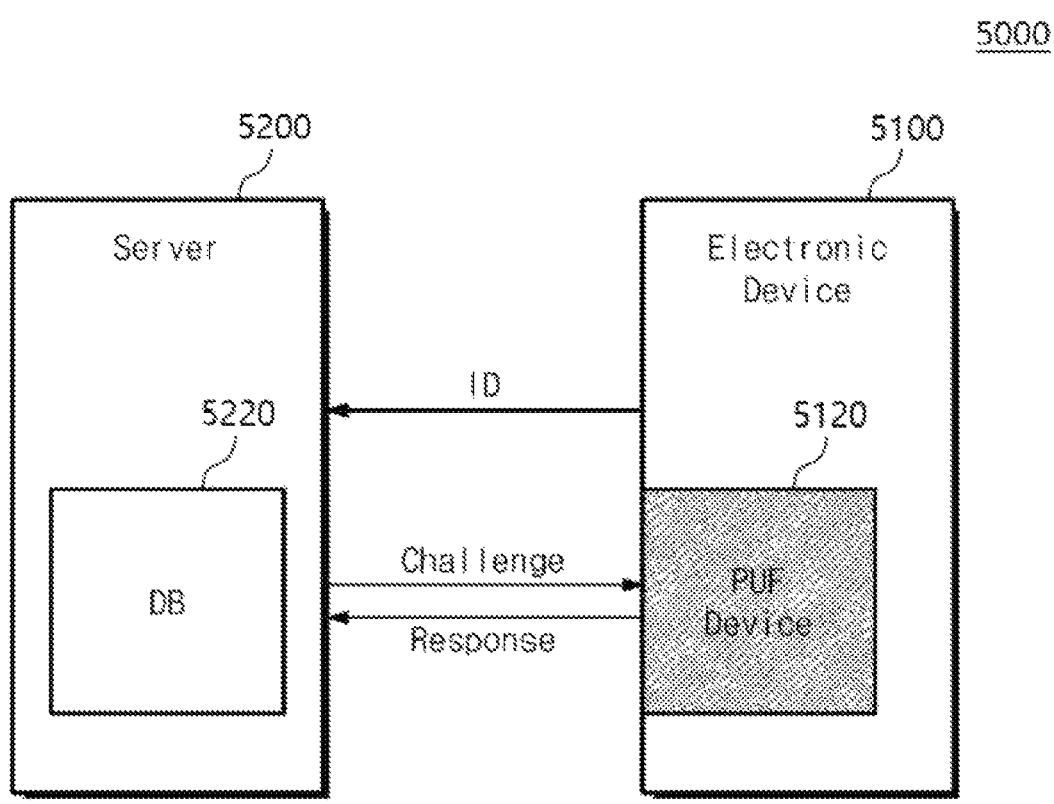
FIG. 13 is a block diagram illustrating a user authentication system including a PUF device according to an embodiment of the present invention.

FIG. 13 is a user authentication system including a PUF device according to example embodiments of inventive concepts. Referring to FIG. 13, a user authentication system 5000 includes an electronic device 5100 and a server 5200. In FIG. 13, the PUF device 5120 is used in authentication procedure of the electronic device 5100.

The electronic device 5100 may provide a user ID generated from the PUF device 5120 to the server 5200. The server 5200 may check whether the user ID provided from the electronic device 5100 is registered in database (DB) 5220. When the user ID is registered, the server 5200 may generate a challenge. The server 5200 may provide a challenge for user authentication to the electronic device 5100.

The electronic device 5100 may receive the challenge from the server 5200 and generate a quantized signal using the PUF device 5120. The PUF device 5120 may generate a response from the quantized signal and provide the response to the server 5200. The user authentication system 5000 according to example embodiments of inventive concepts may include the PUF device 5120 with very large randomness in the electronic device 5100 to safely perform authentication procedure.

With a PUF device according to example embodiments of inventive concepts, a plurality of responses for a single challenge may be generated. Thus, randomness may be significantly enhanced and user authentication may be safely performed from an external attack.

A memory system according to certain embodiments of the inventive concepts may incorporate a memory cell array having a three-dimensional (3D) structure.

Figure 14:
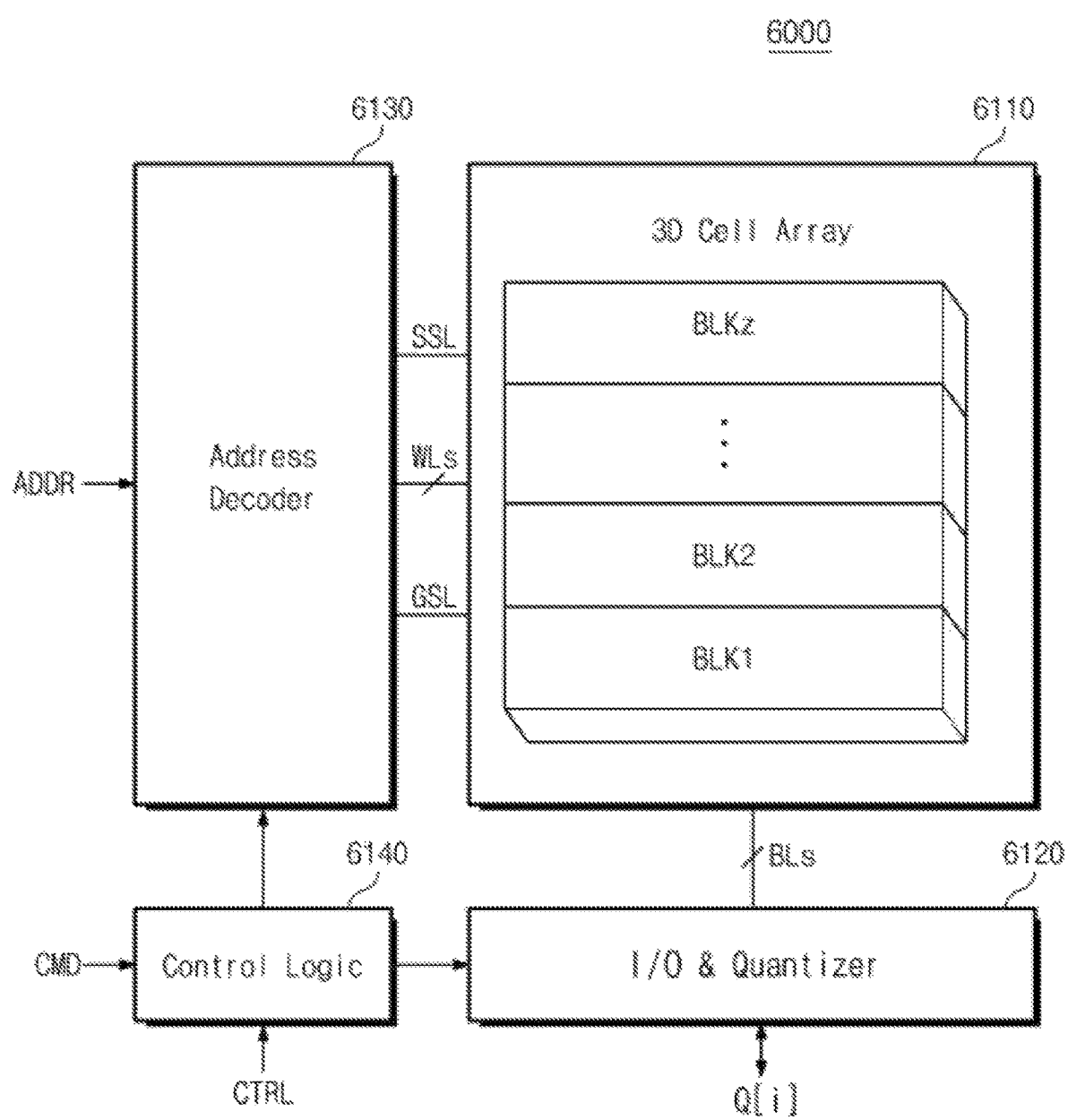
FIG. 14 is a block diagram exemplarily showing a flash memory used in the present invention.

Thus, according to another embodiment of the inventive concept, FIG. 14 is a block diagram illustrating a flash memory 6000 comprising; a three-dimensional (3D) cell array 6110, a data input/output and quantizer 6120, an address decoder 6130, and control logic 6140.

The 3D memory cell array 6110 includes a plurality of memory blocks BLK1 to BLKz, each of which is formed with a three-dimensional (or vertical) structure. For a memory block having a two-dimensional (horizontal) structure, memory cells may be formed in a direction parallel with a substrate. For a memory block having a three-dimensional structure, memory cells may be formed in a direction perpendicular to the substrate. Each of the memory blocks BLK1 to BLKz may be an erase unit of the flash memory 6000.

The data input/output and quantizer 6120 may be connected with the 3D cell array 6110 via a plurality of bit lines. The data input/output and quantizer 6120 may receive data from an external device or output the quantized signal Q[i] read from the 3D memory cell array 6110 to the external device.

The address decoder 6130 may be connected with the 3D cell array 6110 via a plurality of word lines and selection lines GSL and SSL. The address decoder 6130 may select the word lines in response to an address ADDR.

The control logic 6140 may control programming, erasing, reading, etc. of the flash memory 6000. For example, during programming the control logic 6140 may control the address decoder 6130 and the data input/output and quantizer 6120 such that a program voltage is supplied to a selected word line and data is programmed.

Figure 15:
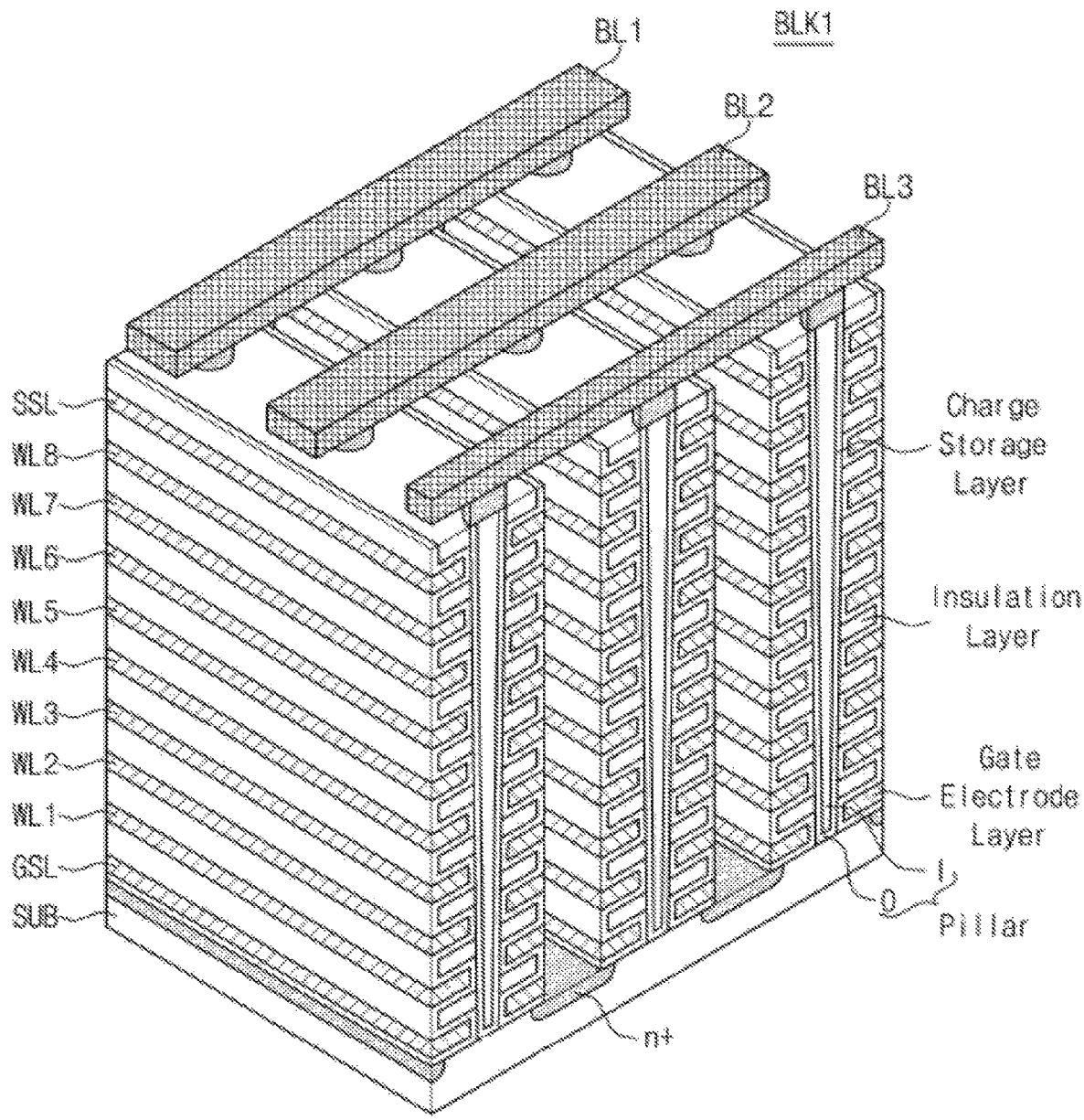
FIG. 15 is a perspective view exemplarily showing a three-dimensional structure of the memory block BLK1 shown in FIG. 14.

FIG. 15 is a perspective view further illustrating in relevant portion the 3D memory cell array structure of a memory block of FIG. 14. Referring to FIG. 15, a memory block BLK1 is formed in a direction perpendicular to a substrate SUB. An n+ doping region may be formed at the substrate SUB. A gate electrode layer and an insulation layer may be deposited on the substrate SUB in turn. A charge storage layer may be formed between the gate electrode layer and the insulation layer.

If the gate electrode layer and the insulation layer are patterned in a vertical direction, a V-shaped pillar may be formed. The pillar may be connected with the substrate SUB via the gate electrode layer and the insulation layer. An outer portion O of the pillar may be formed of a channel semiconductor, and an inner portion I thereof may be formed of an insulation material such as silicon oxide.

The gate electrode layer of the memory block BLK1 may be connected with a ground selection line GSL, a plurality of word lines WL1 to WL8, and a string selection line SSL. The pillars of the memory block BLK1 may be connected with a plurality of bit lines BL1 to BL3. In FIG. 15, there is illustrated the case that one memory block BLK1 has two selection lines SSL and GSL, eight word lines WL1 to WL8, and three bit lines BL1 to BL3. However, the inventive concept is not limited thereto.

Figure 16:
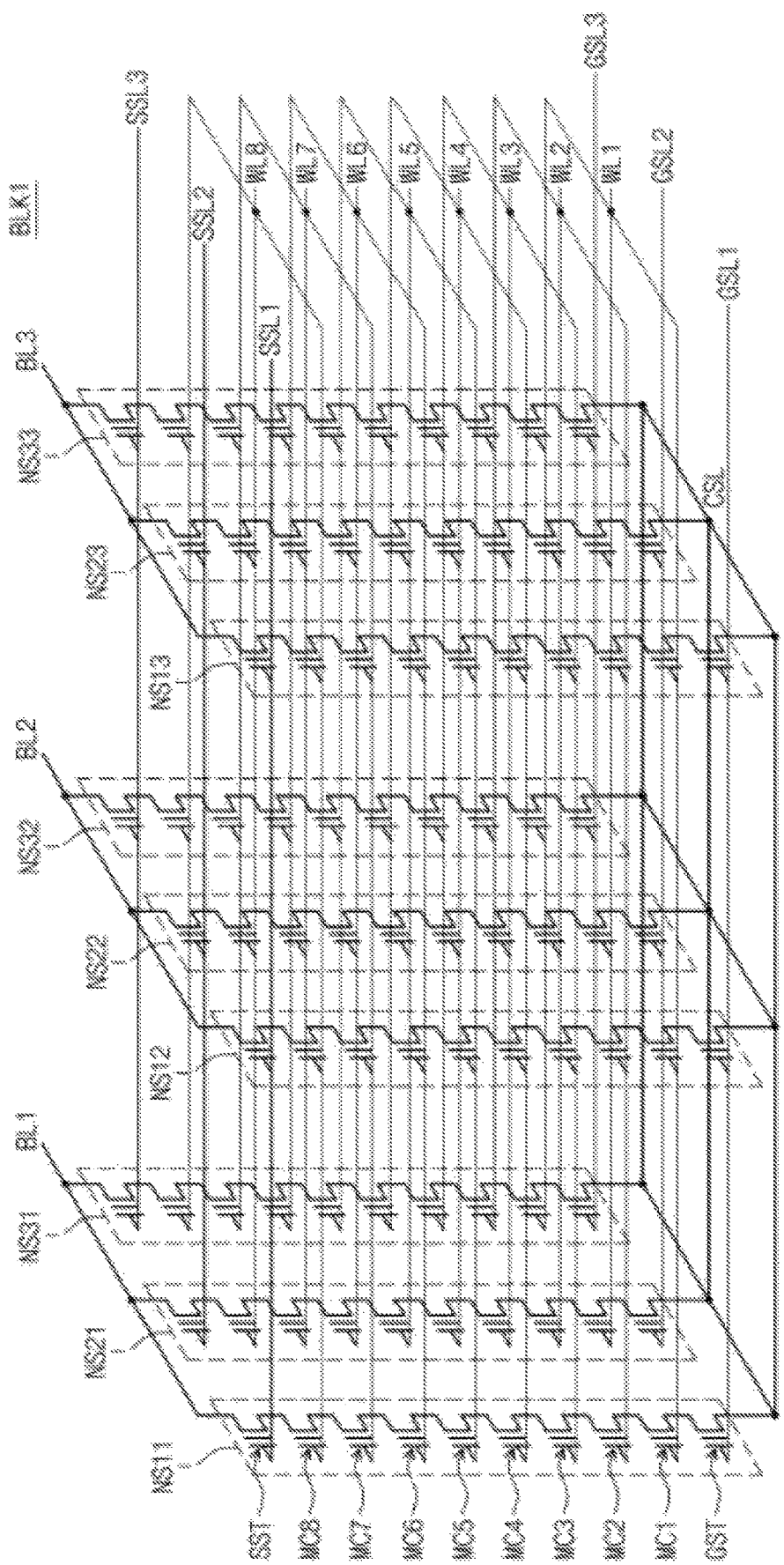
FIG. 16 is an equivalent circuit diagram of the memory block BLK1 shown in FIG. 15.

FIG. 16 is a diagram illustrating in relevant portion an equivalent circuit for the memory block of FIG. 15. Referring to FIG. 16, NAND strings NS11 to NS33 may be connected between bit lines BL1 to BL3 and a common source line CSL. Each NAND string (e.g., NS11) may include a string selection transistor SST, a plurality of memory cells MC1 to MC8, and a ground selection transistor GST.

The string selection transistors SST may be connected with string selection lines SSL1 to SSL3. The memory cells MC1 to MC8 may be connected with corresponding word lines WL1 to WL8, respectively. The ground selection transistors GST may be connected with ground selection line GSL. In each NAND string, the string selection transistor SST may be connected with a bit line, and the ground selection transistor GST may be connected with the common source line CSL.

Word lines (e.g., WL1) having the same height may be connected in common, and the string selection lines SSL1 to SSL3 may be separated from one another. At programming of memory cells (constituting a page) connected with a first word line WL1 and included in NAND strings NS11, NS12, and NS13, there may be selected a first word line WL1 and a first string selection line SSL1.

While the inventive concept has been described with reference to exemplary embodiments, it will be apparent to those skilled in the art that various changes and modifications may be made without departing from the scope of the following claims. Therefore, it should be understood that the above embodiments are not limiting, but illustrative in nature.

The above-described description is specific examples for implementing the present invention. The present invention may include, in addition to the above-described embodiments, embodiments that can be simply modified or changed easily. In addition, the present invention will also include techniques that can be easily modified and implemented using the embodiments. Therefore, the scope of the present invention should not be limited to the above-described embodiments but be determined by the equivalents of the claims of the present invention as well as the claims of the following.

What is claimed is:

1. A flash memory system comprising:
a flash memory programming a selected page, providing a plurality of reference read voltages to a selected word line coupled to the selected page to generate a plurality of signals during a quantization signal generating operation, the plurality of signals corresponding to a plurality of quantization intervals, and generating a quantized signal by performing a logical operation on the plurality of signals; and
a memory controller receiving the quantized signal from the flash memory and generating a response using the quantized signal,
wherein the memory controller receives a challenge from a host and controls the flash memory to perform the quantization signal generating operation.

2. The flash memory system of claim 1,
wherein the selected page is programmed without a program verify operation.

3. The flash memory system of claim 2,
wherein the selected page is programmed with one program voltage or an increasing program voltage.

4. The flash memory system of claim 1,
wherein the plurality of reference read voltages are provided on the selected word line to separate into the plurality of quantization intervals.

5. The flash memory system of claim 4,
wherein the number of quantization intervals is greater than the number of program states.

6. The flash memory system of claim 1,
wherein the flash memory stores data for the quantized signal in some of the memory cells of the selected page.

7. The flash memory system of claim 6,
wherein the challenge includes combination order information for some of the memory cells.

8. The flash memory system of claim 7,
wherein the memory controller manages the combination order information for some memory cells using a map table of a flash translation layer.

9. The flash memory system of claim 1,
wherein the memory controller manages data information matched to a threshold voltage distribution state of the flash memory using a map table of a flash translation layer.

10. The flash memory system of claim 1,
wherein the memory controller receives the quantized signal from the flash memory and generates a quantized key.

11. The flash memory system of claim 1, wherein the selected word line is coupled to a plurality of memory cells, and each of the plurality of signals has a plurality of values, each of the plurality of values indicating whether a threshold voltage of a corresponding one of the plurality of memory cells is in a corresponding one of the quantization intervals, and the flash memory performs an XOR operation on the plurality of signals to generate the quantized signal.

12. A flash memory system comprising:
a flash memory programming a memory block such that a threshold voltage distribution is grouped in units of subblocks, providing a plurality of reference read voltages to selected pages of selected subblocks during a quantization signal generating operation to generate a plurality of signals, the plurality of signals corresponding to a plurality of quantization intervals, respectively, and performing a logical operation on the plurality of signals to generate a quantized signal; and
a memory controller receiving the quantized signal from the flash memory and generating a response using the quantized signal,
wherein the memory controller receives a challenge from a host and controls the flash memory to perform the quantization signal generating operation.

13. The flash memory system of claim 12,
wherein the flash memory programs the memory block with the same data but applies the different program voltage for each subblock.

14. A method of generating a quantized signal of a flash memory system,
receiving a challenge from a host;
selecting a word line according to address information included in the challenge, and programming a selected page connected to the selected word line;
providing a plurality of reference read voltages to the selected word line to generate a plurality of signals, the plurality of signals corresponding to a plurality of quantization intervals, respectively; and
performing a logical operation on the plurality of signals to generate a quantized signal,
wherein the flash memory system generates a response using the quantized signal and provides the response to the host.

15. The method of claim 14, wherein the program operation is performed without the program verify operation during the programming the selected page.

16. The method of claim 14, wherein the selected page is programmed by one program voltage or an increasing program voltage.

17. The method of claim 14, wherein the plurality of reference read voltages are provided on the selected word line to distinguish the plurality of quantization intervals.

18. The method of claim 14, further comprising:
generating a quantized key using the quantized signal.

19. The method of claim 14, wherein data for the quantized signal is stored in some of memory cells of the selected page.

20. The method of claim 19, wherein the challenge includes address information for the selected page.

* * * * *